(12) United States Patent
Shizukuishi et al.

(10) Patent No.: US 7,367,710 B2
(45) Date of Patent: May 6, 2008

(54) DEVELOPING SOLUTION SUPPLY NOZZLE WITH STIRRER

(75) Inventors: Momoko Shizukuishi, Tokyo (JP); Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 575 days.

(21) Appl. No.: 11/010,347

(22) Filed: Dec. 14, 2004

(65) Prior Publication Data
US 2005/0147930 A1    Jul. 7, 2005

(30) Foreign Application Priority Data
Dec. 18, 2003    (JP)    ............... 2003-421329

(51) Int. Cl.
*B01F 15/02*    (2006.01)
(52) U.S. Cl. ............... 366/162.2; 366/172.1; 118/323
(58) Field of Classification Search ............... 366/64, 366/96–99, 134, 162.1, 168.1, 172.1, 172.2, 366/318, 194–196; 118/319–321, 323
See application file for complete search history.

(56) References Cited

U.S. PATENT DOCUMENTS

| | | | |
|---|---|---|---|
| 5,139,715 A * | 8/1992 | Katsuno et al. ............ | 264/46.4 |
| 5,854,953 A | 12/1998 | Semba | |
| 6,267,516 B1 | 7/2001 | Nagamine et al. | |
| 6,284,043 B1 | 9/2001 | Takekuma | |
| 6,602,382 B1 | 8/2003 | Matsuyama et al. | |
| 2005/0223980 A1* | 10/2005 | Awamura et al. ........... | 118/323 |
| 2007/0184178 A1* | 8/2007 | Yamamoto et al. ......... | 118/323 |

FOREIGN PATENT DOCUMENTS

EP    451921 A1 * 10/1991
JP    08-97191 A    4/1996

* cited by examiner

*Primary Examiner*—Charles E. Cooley
(74) *Attorney, Agent, or Firm*—Rader, Fishman & Grauer PLLC

(57) ABSTRACT

According to the present invention, an anti-reflective film formed under a resist film is removed in a photolithography process of a wafer without affecting the resist film. According to the present invention, in a photolithography process of a substrate, an anti-reflective film having solubility in the developing solution is formed and thereafter a resist film is formed. In development treatment after exposure processing, a developing solution is supplied to the substrate to develop the resist film. At an instant when the development of the resist film is finished, a second developing solution lower in concentration than the developing solution is supplied to the substrate. Only the anti-reflective film is dissolved and removed by the supply of the second developing solution. The developing solution is supplied to the substrate by a supply nozzle having a stirrer.

8 Claims, 14 Drawing Sheets

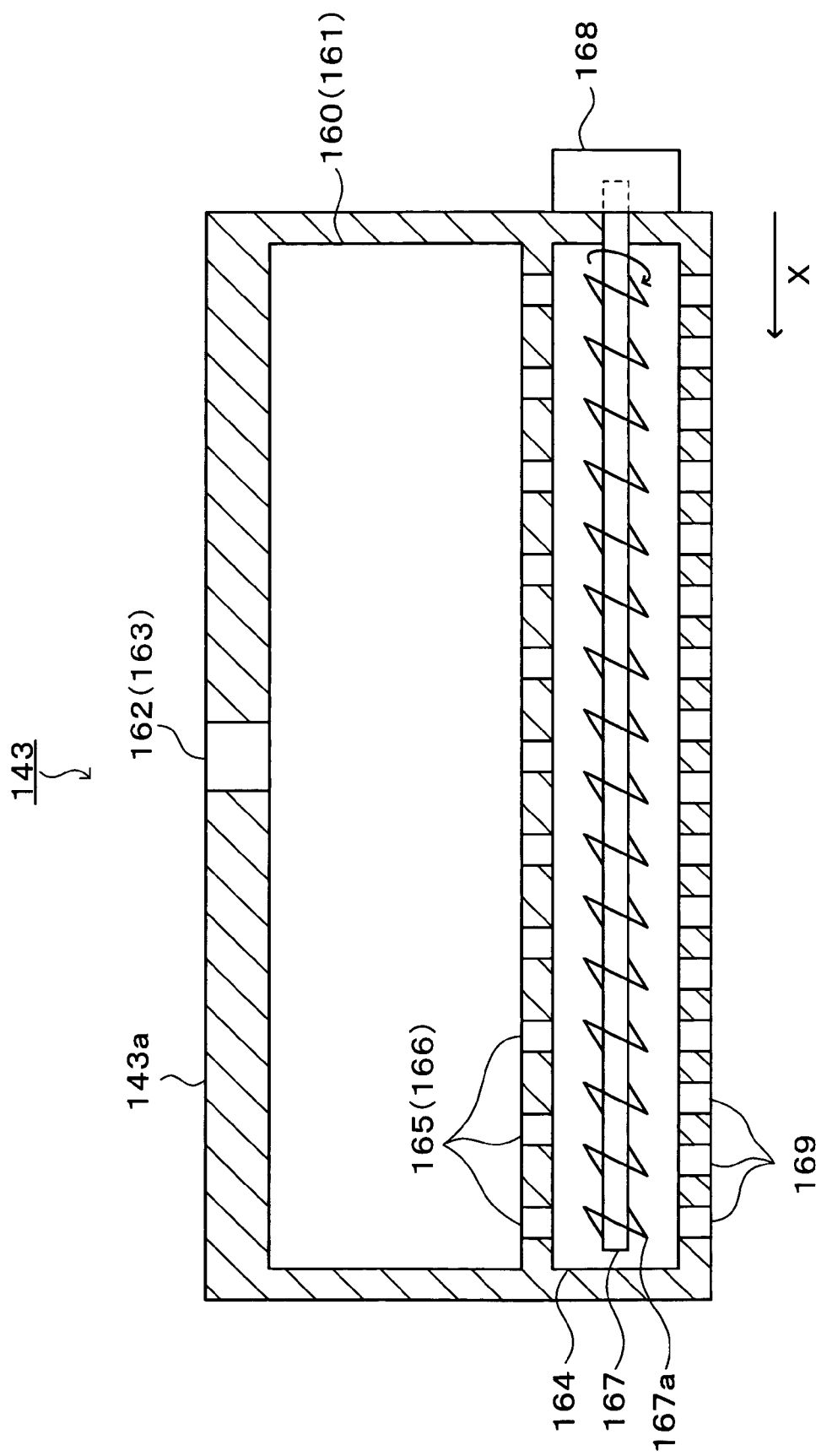

DEVELOPING SOLUTION SUPPLY NOZZLE WITH STIRRER

BACKGROUND OF THE INVENTION

1. Field of the Invention

The present invention relates to a substrate developing method, a substrate processing method, and a developing solution supply nozzle.

2. Description of the Related Art

In a photolithography process in fabrication processes of a semiconductor device, resist coating treatment in which a resist film is formed by applying a resist solution on a film to be etched that is formed on a surface of, for example, a wafer, exposure processing in which the resist film on the wafer is exposed in a predetermined pattern, development treatment in which the resist film is developed by supplying a developing solution to the exposed wafer, and etching treatment in which the film to be etched is etched, using the resist film in the predetermined pattern as a mask, and so on are performed in sequence.

In the photolithography process, an anti-reflective film is sometimes formed as a base film of the resist film prior to the resist coating treatment in order to, for example, prevent the resist film from being excessively exposed by light which is reflected on the film to be etched after transmitting through the resist film during the exposure processing.

When, for example, the base film is thus formed between the film to be etched and the resist film, it is necessary to separately etch the base film on an upper layer of the film to be etched before the film to be etched is etched. The etching treatment of this base film has been generally conducted in such a manner that an etching gas is plasmatized in a chamber housing a wafer to cause a chemical reaction of a surface of the base film with plasma particles (Japanese Patent Application Laid-open No. Hei 8-97191).

However, due to the use of high-energy plasma particles in the etching treatment of the base film, the resist film is greatly damaged, and for example, as shown in FIG. 14, a surface of a resist film R on an upper layer is etched off to sometimes cause great inclination of a side face of the resist film R which should be in a rectangular shape.

With such inclination of the side face of the resist film R, in the etching treatment of the film to be etched, the film to be etched is etched more than necessary to become smaller than a predetermined size, so that a pattern with a desired line width and dimension is not formed on the wafer. Especially in recent years when high density and microfabrication of semiconductor devices are progressing, realizing a photolithography process with high dimensional precision has become an important issue.

Further, in the conventional etching treatment of the base film, a large amount of an upper surface of the resist film R is also sometimes etched off in a vertical direction. This reduces the total film thickness of the resist film R and the base film, which sometimes disables the resist film R from fully functioning as a mask for the film to be etched.

SUMMARY OF THE INVENTION

The present invention was made in view of the above-described respects, and it is an object of the present invention to provide a substrate developing method and a substrate processing method capable of removing a base film formed on a lower layer of a resist film without affecting the resist film in a photolithography process of a substrate such as a wafer, and to provide a developing solution supply nozzle used in these processing methods.

According to a first aspect of the present invention, the present invention is a method of developing a substrate having a predetermined base film formed on a lower layer of a resist film, the method comprising the steps of: supplying a developing solution to the substrate to develop the resist film formed on the substrate; and thereafter supplying a predetermined treatment solution to the substrate to dissolve the base film at a portion exposed by the development of the resist film.

According to this invention, unlike in the prior art, the base film is dissolved by the treatment solution instead of being etched by high-energy plasma particles. Therefore, the resist film on the upper layer is not damaged greatly and it can be prevented that a surface of the resist film is etched off while the base film is removed. As a result, when a film to be etched on a lower layer is etched, following, for example, the removal of the base film, the resist film functions as a mask with accurate size. Consequently, a pattern with high dimensional accuracy can be formed on the substrate. In addition, since the etching of the base film, which has been conventionally necessary, is not required, the time required for forming the pattern can be shortened, resulting in an improved throughput of the substrate processing.

The base film may have solubility in the developing solution, and the predetermined treatment solution may be a developing solution lower in property of dissolving the resist film than the aforesaid developing solution. In such a case, it is possible to dissolve the base film by the developing solution lower in dissolving property than the developing solution used for developing the resist film, thereby removing the base film after the resist film is developed by the developing solution. This prevents the degeneration of the resist film since the developing solution is used as the treatment solution for dissolving the base film. Further, the use of the developing solution lower in property of dissolving the resist film prevents excessive development of the resist film.

Incidentally, if density of dissolved portions is nonuniform in the resist film when it is developed, the developing solution in dense portions is lower in developing capability than the developing solution in scarce portions after dissolving the resist film. Therefore, if, for example, the developing solution used for developing the resist film is used as it is to dissolve the base film, it would cause difference in solubility of the base film among the scarce portions and the dense portions of the resist film. According to the present invention, since the fresh developing solution appropriate for dissolving the base film is supplied after the development of the resist film is finished, the dissolution of the base film can be uniform on the surface of the substrate irrespective of density variation of the dissolved portions of the resist film. Note that the predetermined treatment solution may be a developing solution lower in at least one of concentration and temperature than the developing solution used for developing the resist film.

The predetermined treatment solution may be supplied to the substrate to start dissolving the base film when the dissolution of the resist film reaches a surface of the base film in accordance with progress of the development of the resist film by the developing solution. This enables appropriate shift from the development of the resist film to the dissolution of the base film.

The developing method may further comprise the step of removing the developing solution on the substrate between the step of developing the resist film on the substrate and the step of supplying the predetermined treatment solution to the substrate. In this case, it is possible to once stop the development of the resist film completely and to thereafter start the removal of the base film anew, which enables more reliable prevention of excessive development of the resist film.

The supply of the predetermined treatment solution to the substrate may be performed by using a nozzle having discharge ports that are arranged in an area longer than a specific direction dimension of the substrate and by moving the nozzle discharging the predetermined treatment solution above the substrate. Further, the same nozzle for supplying the predetermined treatment solution may be used when the developing solution is supplied for developing the resist film. Note that the base film in the inventions described hitherto may be an anti-reflective film preventing reflection of light in exposure processing.

According to another aspect of the present invention, the present invention is a substrate processing method including a photolithography process, and the photolithography process includes the steps of: forming on a substrate an anti-reflective film having solubility in a developing solution used in development treatment and preventing reflection of light in exposure processing, before forming a resist film on the substrate; and in the development treatment after the exposure processing, supplying to the substrate a developing solution that is lower in at least one of concentration and temperature than the developing solution used in the development treatment of the resist film, to thereby dissolve a portion of the anti-reflective film exposed by the development of the resist film, before supplying the developing solution to the substrate to develop the resist film.

According to still another aspect of the present invention, the present invention is a developing solution supply nozzle supplying a developing solution to a substrate, the nozzle comprising: a main body in a slender shape having a length substantially equal to or larger than a specific direction dimension of the substrate; a developing solution storage chamber extending in the main body in a longitudinal direction of the main body to store the developing solution; a liquid storage chamber extending in the main body in the longitudinal direction of the main body to store a predetermined liquid that is to be mixed in the developing solution; and a mixing chamber which extends in the main body in the longitudinal direction of the main body to communicate with the developing solution storage chamber and the liquid storage chamber and in which the developing solution flowing from the developing solution storage chamber and the liquid flowing from the liquid storage chamber are mixed. The nozzle further includes: discharge ports provided in a lower surface of the main body to communicate with the mixing chamber, and having openings arranged along the longitudinal direction to discharge the developing solution mixed in the mixing chamber; and a stirring stick extending in the mixing chamber along the longitudinal direction to stir the developing solution and the liquid which flow into the mixing chamber. The developing solution supply nozzle of this invention further includes a rotation driving section driving the stirring stick to rotate around an axis of the stirring stick.

According to the developing solution supply nozzle as structured above, it is possible to mix the developing solution supplied from the developing solution storage chamber and the liquid supplied from the liquid storage chamber at a predetermined ratio in the mixing chamber to produce a developing solution, for example, with a predetermined concentration or at a predetermined temperature. In the mixing chamber, the rotation driving section can actively rotate the stirring stick, so that it is possible to fully stir the developing solution and the liquid flowing thereto to produce the developing solution with uniform concentration or at uniform temperature. According to this developing solution supply nozzle, changing the mixing ratio of the developing solution and the liquid in the mixing chamber will enable the production of a plurality of kinds of developing solutions different in concentration or temperature. Further, this developing solution supply nozzle can be used, for instance, for supplying the developing solution to a substrate to develop a resist film and for thereafter supplying a developing solution lower in concentration or temperature to dissolve a base film such as an anti-reflective film. Therefore, the substrate developing method and the substrate processing method according to the aforesaid inventions can be suitably carried out.

In a developing solution supply nozzle according to yet another aspect of the present invention, instead of rotating the stirring stick extending along the longitudinal direction, a flow path extending from the developing solution storage chamber to communicate with the mixing chamber and a flow path extending from the liquid storage chamber to communicate with the mixing chamber are formed so that the developing solution and the liquid flowing into the mixing chamber from the developing solution storage chamber and the liquid storage chamber flow in directions deviated from an axial center of the stirring stick in the mixing chamber to collide with the stirring stick.

According to this invention, it is possible to mix in the mixing chamber the developing solution supplied from the developing solution storage chamber and the predetermined liquid supplied from the liquid storage chamber at a predetermined ratio to produce the developing solution, for example, with a predetermined concentration or at a predetermined temperature. In the mixing chamber, the developing solution supplied from the developing solution storage chamber and the liquid supplied from the liquid storage chamber flow in the directions deviated from the axial center of the stirring stick to collide with the stirring stick, so that the stirring stick is rotated by this collision. The developing solution and the liquid flowing into the mixing chamber can be fully stirred by the rotation of the stirring stick, so that a developing solution uniform in concentration or temperature can be produced in the mixing chamber. According to this developing solution supply nozzle, changing a mixing ratio of the developing solution and the liquid in the mixing chamber makes it possible to produce a plurality of kinds of developing solutions different in concentration or temperature. Therefore, it is possible, for example, to supply the developing solution to a substrate to develop a resist film, and thereafter supply a developing solution lower in concentration or temperature to the substrate to dissolve a base film such as an anti-reflective film, through the use of the developing solution supply nozzle. Therefore, the substrate developing method and the substrate processing method according to the aforesaid inventions can be suitably carried out.

The stirring stick may be formed in a spiral shape and may be made of a porous material. This can further promote the mixture of the developing solution and the liquid in the mixing chamber.

The mixing chamber may have a circular vertical cross section as viewed in a direction along an axis of the stirring stick. This structure further promotes the rotation of the stirring stick around the axis thereof by the fluids flowing, for example, along an inner wall of the mixing chamber, so that the developing solution and the liquid are further stirred fully.

A flow path of the developing solution from the mixing chamber to each of the discharge ports in the main body may be formed to once narrow down on a downstream side of the mixing chamber and thereafter widen. This structure increases the residence time of the liquid in the mixing chamber since the vicinity of an outlet of the mixing chamber narrows down, thereby promoting the mixture of the developing solution and the liquid. Further, since the flow path widens toward the outlet of the discharge port, the pressure of the developing solution which has risen at the outlet of the mixing chamber can be reduced. This as a result reduces shock of the collision of the developing solution with the surface of the substrate, so that a development flaw caused by the collision of the developing solution can be prevented.

The predetermined liquid may be pure water or may be a developing solution lower in temperature than the developing solution stored in the developing solution storage chamber.

BRIEF DESCRIPTION OF THE DRAWINGS

FIG. 7 is a vertical cross-sectional view of the developing solution supply nozzle viewed in a Y direction;

DETAILED DESCRIPTION OF THE PREFERRED EMBODIMENT

Figure 1:
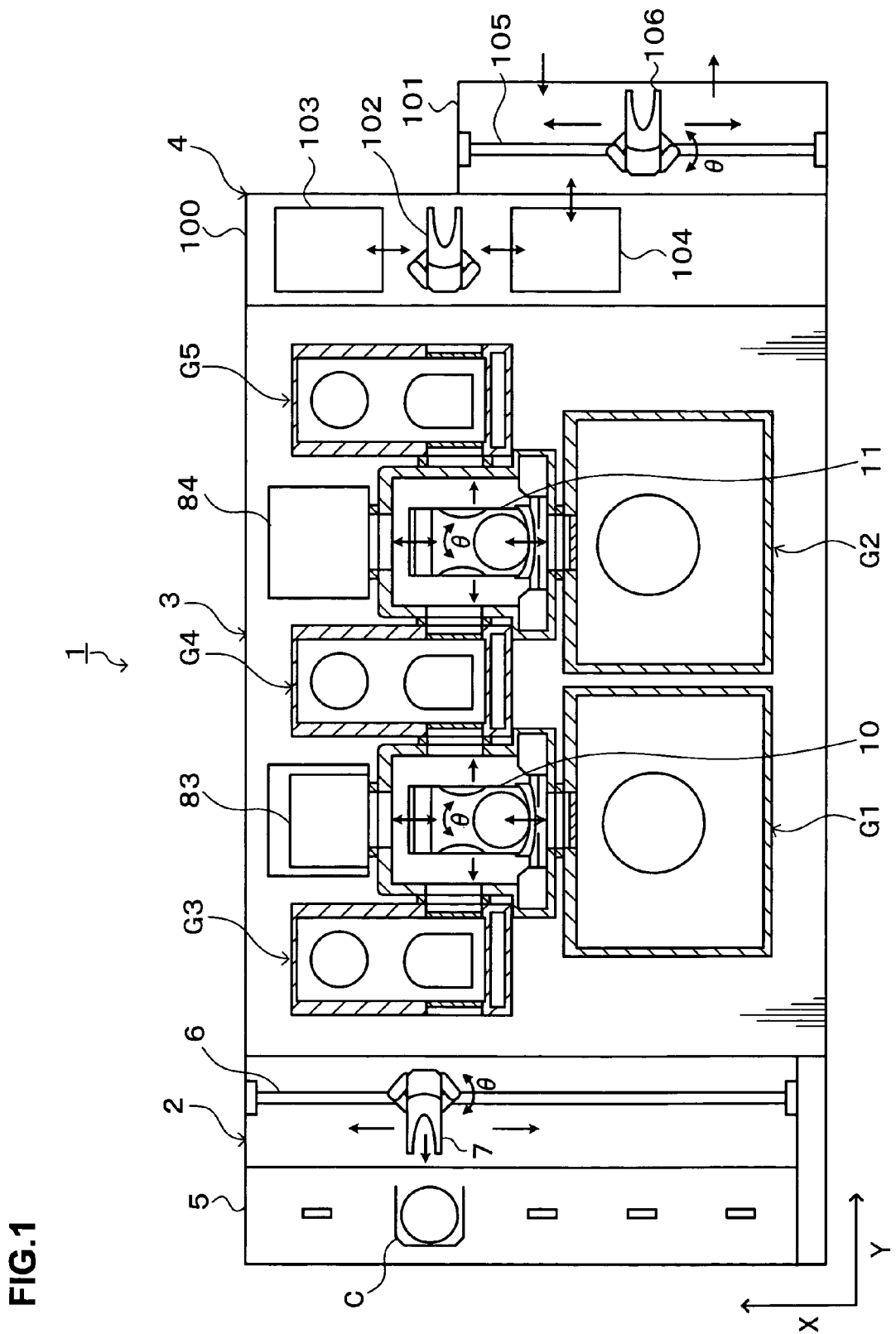
FIG. 1 is a plane view schematically showing the configuration of a coating and developing system in an embodiment of the present invention.
Figure 2:
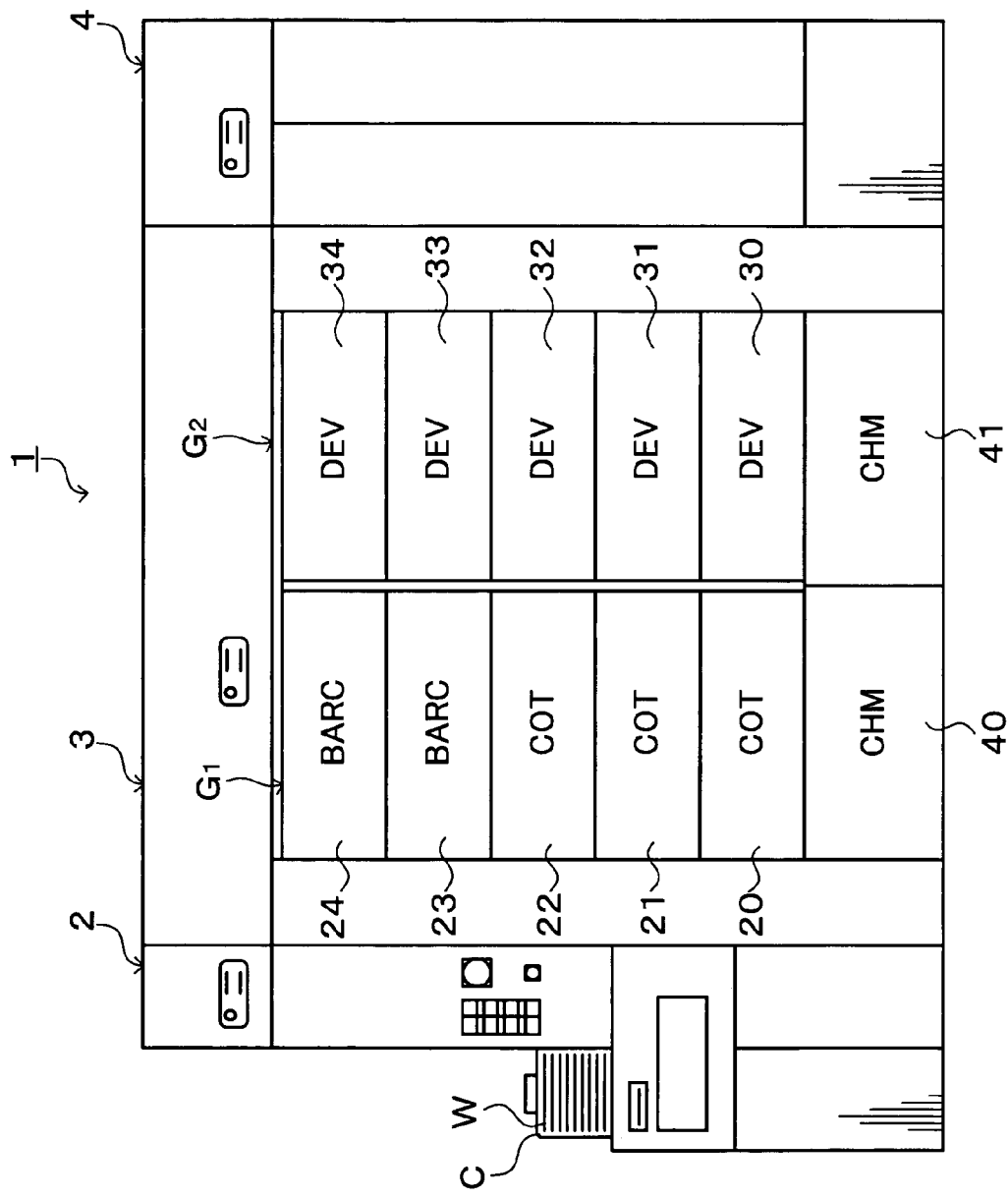
FIG. 2 is a front view of the coating and developing system in FIG. 1.
Figure 3:
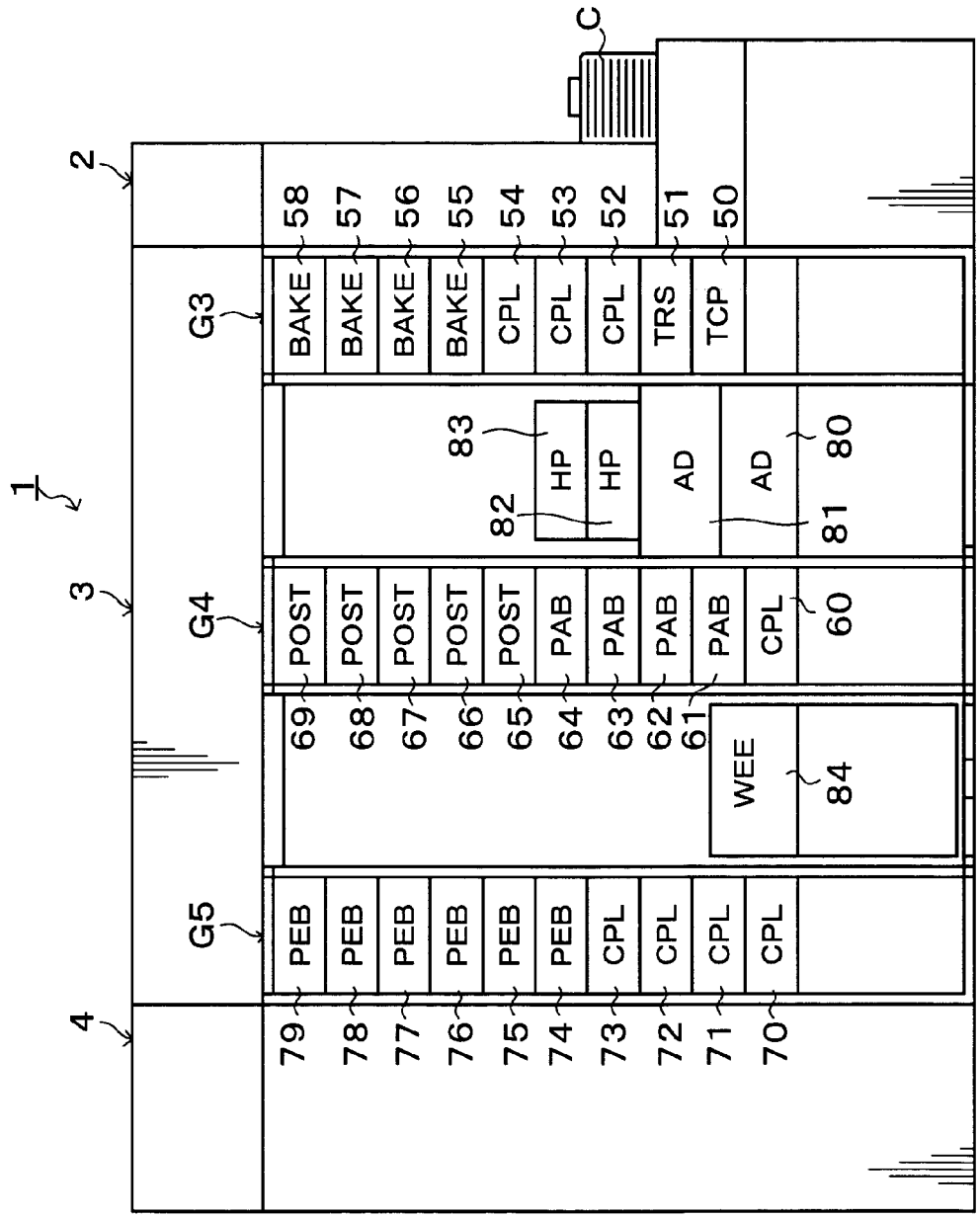
FIG. 3 is a rear view of the coating and developing system in FIG. 1.

Hereinafter, a preferred embodiment of the present invention will be described. FIG. 1 is a plane view schematically showing the configuration of a coating and developing system 1 in which a photolithography process of substrate processing is carried out, FIG. 2 is a front view of the coating and developing system 1, and FIG. 3 is a rear view of the coating and developing system 1.

As shown in FIG. 1, the coating and developing system 1 includes a cassette station 2, a processing station 3, and an interface section 4 which are integrally connected. In the cassette station 2, for example, 25 pieces of wafers W per cassette are carried in a unit into/out of the coating and developing system 1 from/into the outside and the wafer W is carried into/out of a cassette C. In the processing station 3, various kinds of processing units for performing predetermined processing on wafer-by-wafer basis in coating and development treatment are arranged in multiple tiers. In the interface section 4, the wafer W is delivered to/from a not-shown aligner provided adjacent to the processing station 3. In the cassette station 2, a plurality of cassettes C are mountable in a line in an X direction (up/down direction in FIG. 1) at predetermined positions of a cassette mounting table 5 which serves as a mounting section. The cassette station 2 has a wafer carrier 7 movable in the X direction on a carrier guide 6. The wafer carrier 7 is also movable in a wafer alignment direction (Z direction; vertical direction) of the wafers W housed in the cassette C and is capable of selectively accessing the wafer W in each of the cassettes C arranged in the X direction.

The wafer carrier 7 is rotatable in a θ direction around a Z axis and is also capable of accessing a temperature controller 50 and a transition device 51 belonging to a later-described third processing unit group G3 on a processing station 3 side.

The processing station 3 adjacent to the cassette station 2 includes, for example, five processing unit groups G1 to G5 in each of which a plurality of processing units are arranged in multiple tiers. On an X-direction negative side (lower side in FIG. 1) in the processing station 3, the first processing unit group G1 and the second processing unit group G2 are arranged in this order from the cassette station 2 side. On an X-direction positive side (upper side in FIG. 1) in the processing station 3, the third processing unit group G3, the fourth processing unit group G4, and the fifth processing unit group G5 are arranged in this order from the cassette station 2 side. A first carrier 10 is provided between the third processing unit group G3 and the fourth processing unit group G4. The first carrier 10 is capable of selectively accessing the first processing unit group G1, the third processing unit group G3, and the fourth processing unit group G4 to transfer the wafer W thereto/therefrom. A second carrier 11 is provided between the fourth processing unit group G4 and the fifth processing unit group G5. The second carrier 11 is capable of selectively accessing the second processing unit group G2, the fourth processing unit group G4, and the fifth processing unit group G5 to transfer the wafer W thereto/therefrom.

As shown in FIG. 2, in the first processing unit group G1, liquid treatment units each supplying a predetermined liquid to the wafer W for treatment, for example, resist coating units 20, 21, 22 each applying a resist solution to the wafer W and bottom coating units 23, 24 each forming an anti-reflective film as a base film for preventing reflection of light of exposure processing are stacked in five tiers in this order from the bottom. In the second processing unit group G2, liquid treatment units, for example, developing units 30 to 34 that perform development treatment according to this embodiment are stacked in five tiers in this order from the bottom. Further, on the lowest tiers of the first processing unit group G1 and the second processing unit group G2, chemical chambers 40, 41 for supplying various kinds of treatment solutions to the liquid treatment units in the processing unit groups G1 and G2 are provided respectively.

For example, as shown in FIG. 3, in the third processing unit group G3, the temperature controller 50, the transition unit 51 where the delivery of the wafer W is performed, high-precision temperature controllers 52 to 54 heating the wafer W under precisely controlled temperature, and high-temperature thermal processing units 55 to 58 heating the wafer at high temperature are stacked in nine tiers in this order from the bottom.

In the fourth processing unit group G4, for example, a high-precision temperature controller 60, pre-baking units 62 to 64 heating the wafer W which has been subjected to resist coating treatment, and post-baking units 65 to 69 heating the wafer W which has been subjected to the development treatment are stacked in ten tiers in this order from the bottom.

In the fifth processing unit group G5, a plurality of thermal processing units for thermally processing the wafer W, for example, high-precision temperature controllers 70 to 73 and post-exposure baking units 74 to 79 thermally processing the wafer W which has been subjected to the exposure processing are stacked in ten tiers in this order from the bottom.

As shown in FIG. 1, a plurality of processing units are arranged on the X-direction positive side of the first carrier 10, and for example, as shown in FIG. 3, adhesion units 80, 81 for hydrophobic treatment of the wafer W and heating units 82, 83 for heating the wafer W are stacked in four tiers in this order from the bottom. As shown in FIG. 1, on the X-direction positive side of the second carrier 11, for example, an edge exposure unit 84 for selectively exposing only an edge portion of the wafer W is disposed.

As shown in FIG. 1, the interface section 4 includes a first interface part 100 and a second interface part 101 arranged in this order from the processing station 3 side. In the first interface part 100, a wafer carrier 102 is disposed at a position corresponding to the fifth processing unit group G5. On X-direction sides of the wafer carrier 102, for example, buffer cassettes 103, 104 are installed. The wafer carrier 102 is capable of accessing the processing units in the fifth processing unit group G5 and accessing the buffer cassettes 103, 104. In the second interface part 101, a wafer carrier 106 that moves on a carrier guide 105 extending in the X direction is provided. The wafer carrier 106 is movable in the Z direction and is also rotatable in the θ direction, so that it is capable of accessing a not-shown aligner adjacent to the second interface part 101 and accessing the buffer cassette 104. Therefore, the wafer W in the processing station 3 can be carried to the aligner via the wafer carrier 102, the buffer cassettes 103, 104, and the wafer carrier 106, and the wafer W after being subjected to the exposure processing can be carried into the processing station 3 via the wafer carrier 106, the buffer cassette 104, and the wafer carrier 102.

Figure 4:
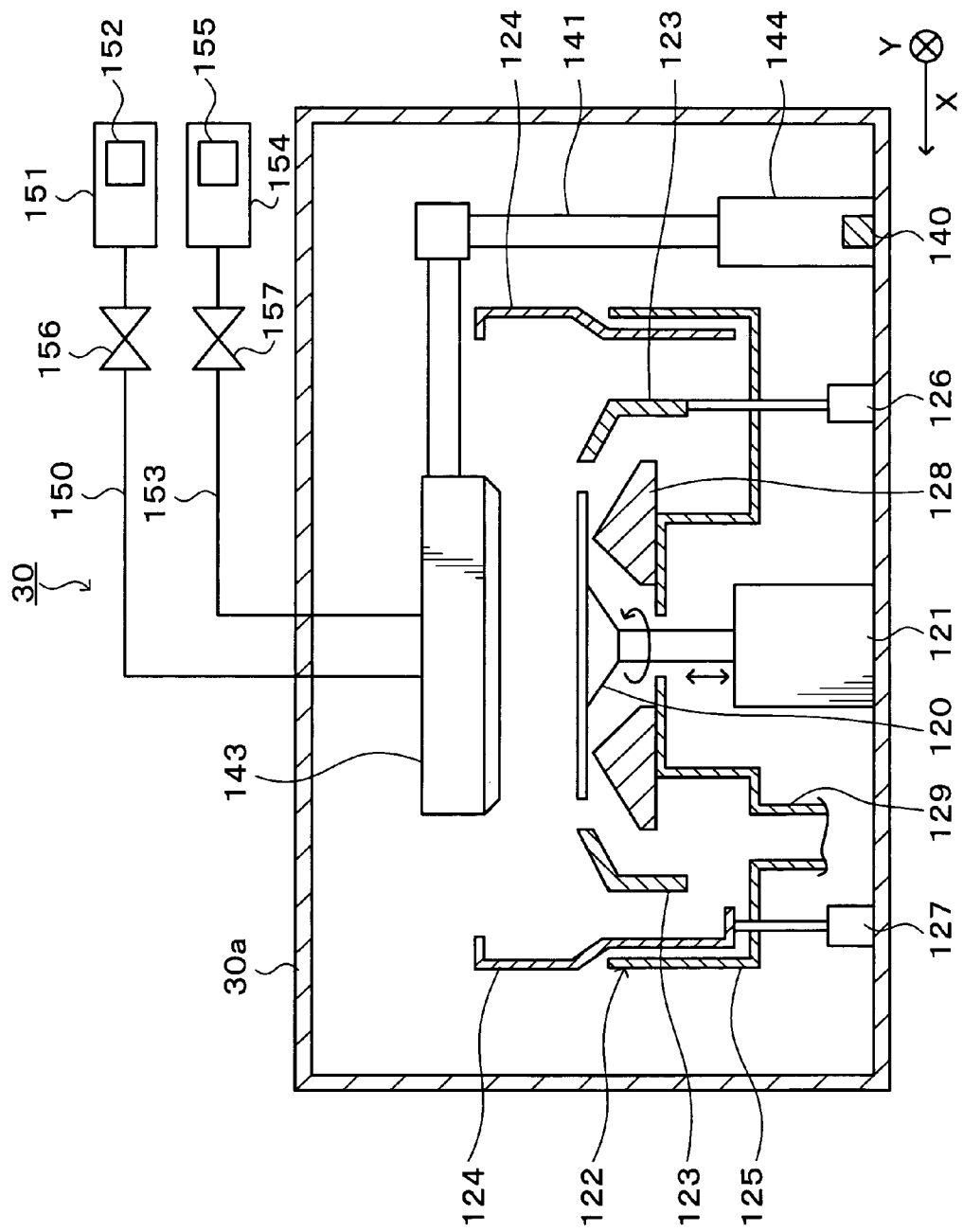
FIG. 4 is an explanatory view of a vertical cross section schematically showing the configuration of a developing unit.
Figure 5:
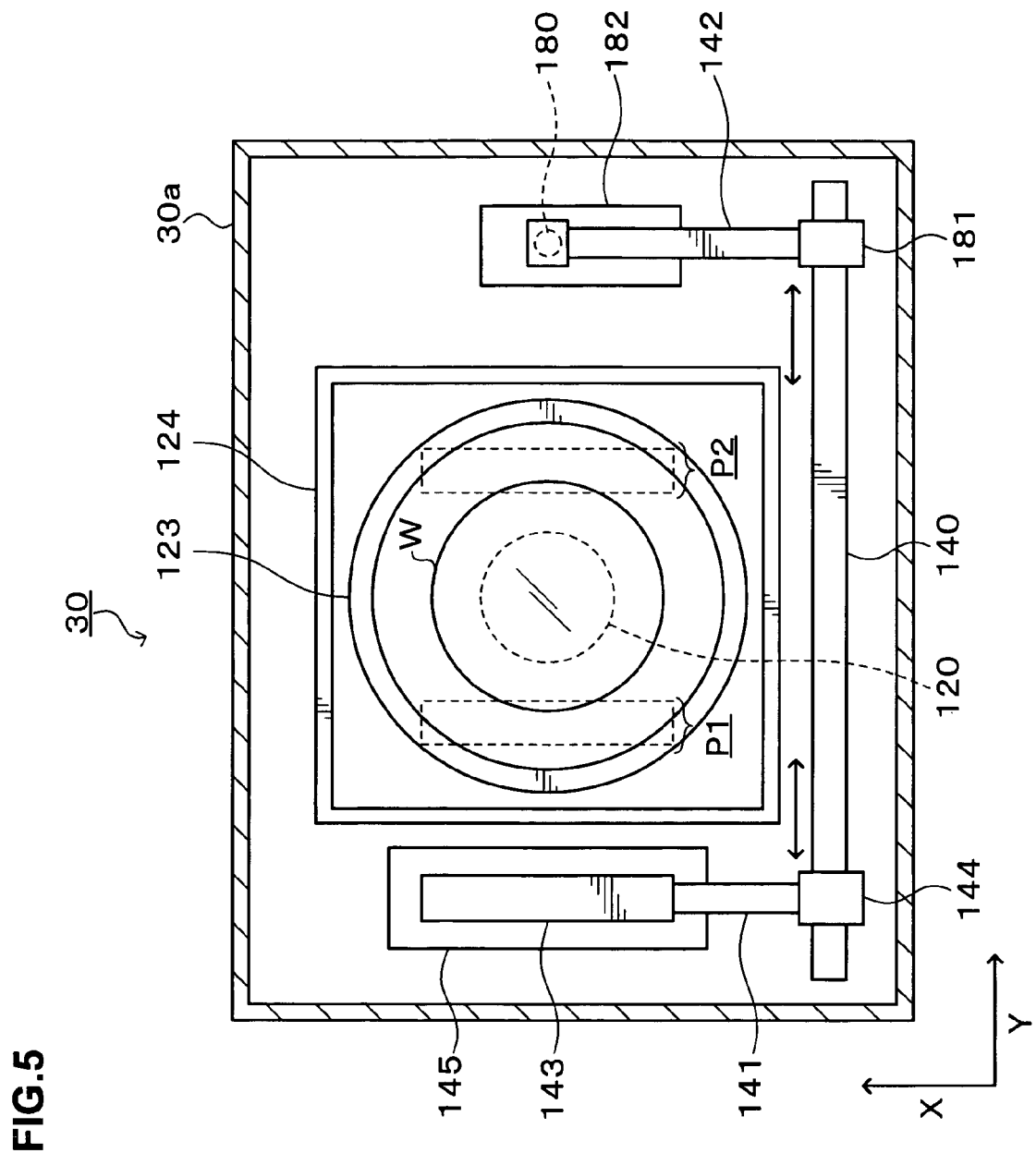
FIG. 5 is an explanatory view of a horizontal cross section schematically showing the configuration of the developing unit.

Next, the configuration of the aforesaid developing unit 30 will be detailed. Since the developing units 31 to 34 have the same configuration as that of the developing unit 30, they will not be described. FIG. 4 is an explanatory view of a vertical cross section schematically showing the configuration of the developing unit 30, and FIG. 5 is an explanatory view of a horizontal cross section of the developing unit 30.

As shown in FIG. 4, the developing unit 30 has a casing 30a, and in a center portion of the casing 30a, a spin chuck 120 to hold the wafer W is provided. The spin chuck 120 has a horizontal upper surface, and has in this upper surface, for example, a suction port (not shown) to suck the wafer W. By a sucking force from the sucking port, the wafer W can be suction-held by the spin chuck 120.

The spin chuck 120 has, for example, a chuck driving mechanism 121 for rotating and moving up/down the spin chuck 120. The chuck driving mechanism 121 includes: for example, a rotation driving section (not shown) such as a motor for rotating the spin chuck 120 around a vertical axis at a predetermined speed; and a hoisting/lowering driving section (not shown) such as a motor or a cylinder for hoisting/lowering the spin chuck 120. The chuck driving mechanism 121 enables the wafer W on the spin chuck 60 to move up/down at a predetermined timing or to rotate at a predetermined speed.

Around the spin chuck 120, a cup 122 for receiving and collecting liquid scattering or dropping from the wafer W is provided. In the cup 122, for example, an inner cup 123 surrounding the periphery of the spin chuck 120, an outer cup 124 covering the outside of the inner cup 123, and a bottom 125 covering lower surfaces of the inner cup 123 and the outer cup 124 are separately formed. The inner cup 123 and the outer cup 124 are capable of mainly receiving the liquid scattering to the outside of the wafer W, and the bottom 125 is capable of collecting the liquid dropping from inner walls of the inner cup 123 and the outer cup 124 and from the wafer W.

The inner cup 123 is formed, for example, in a substantially cylindrical shape and an upper end portion thereof inclines inner upward. The inner cup 123 is capable of moving up/down when driven by the hoisting/lowering driving section 126 such as, for example, a cylinder. The outer cup 124 is formed in a substantially cylindrical shape which is in a quadrangular shape in a plane view, for example, as shown in FIG. 5. The outer cup 124 is capable of moving up/down when driven by a hoisting/lowering driving section 127 such as, for example, a cylinder as shown in FIG. 4. The spin chuck 120 passes through the center portion of the bottom 125. Around the spin chuck 120, an annular member 128 blocking the flow of, for example, the liquid entering a rear face from a front face of the wafer W is provided. The annular member 128 has apex portions adjacent to, for example, the rear face of the wafer W, and the apex portions can block the liquid flowing along the rear face of the wafer W. A drain pipe 129 communicating with, for example, a drainage section of a factory is connected to the bottom 125, so that the liquid collected in the cup 122 can be drained from the drain pipe 129 to the outside of the developing unit 30.

As shown in FIG. 5, on the X-direction negative side (lower side in FIG. 5) of the cup 122, a rail 140 extends along the Y direction. The rail 140 is formed outside the cup 122, extending, for example, from the Y-direction negative side (left side in FIG. 5) to the Y-direction positive side (right side in FIG. 5). Two arms 141, 142 are attached to the rail 140. The first arm 141 supports a developing solution supply nozzle 143. The first arm 141 is movable in the Y direction on the rail 140 when driven by a driving mechanism 144, so that it is capable of transferring the developing solution supply nozzle 143 from a standby section 145 provided outside the cup 122 to the inside of the cup 122. Further, the first arm 141 is also movable in an up/down direction when driven by, for example, the driving mechanism 144, so that it is capable of moving up/down the developing solution supply nozzle 143.

As shown in FIG. 4, the developing solution supply nozzle 143 communicates with a developing solution supply source 151 installed, for example, outside the casing 30a via a developing solution supply pipe 150. A developing solution with a predetermined concentration is stored in the developing solution source 151 in advance. The developing solution supply source 151 has, for example, a temperature control section 152, so that the developing solution supply source 151 can supply the developing solution at a predetermined temperature to the developing solution supply nozzle 143. The developing solution supply nozzle 143 also communicates with a liquid supply source 154 storing, for example, a predetermined liquid via a liquid supply pipe 153. In this embodiment, the liquid supply source 154 stores pure water. The liquid supply source 154 has, for example, a temperature control section 155, so that the liquid supply source 154 can supply the pure water at a predetermined temperature to the developing solution supply nozzle 143. Valves 156, 157 capable of regulating the flow rate are attached to the developing solution supply pipe 150 and the liquid supply pipe 153 respectively, and the valves 156, 157 enable the supply of the developing solution and the pure water at predetermined flow rates to the developing supply nozzle 143.

Figure 6:
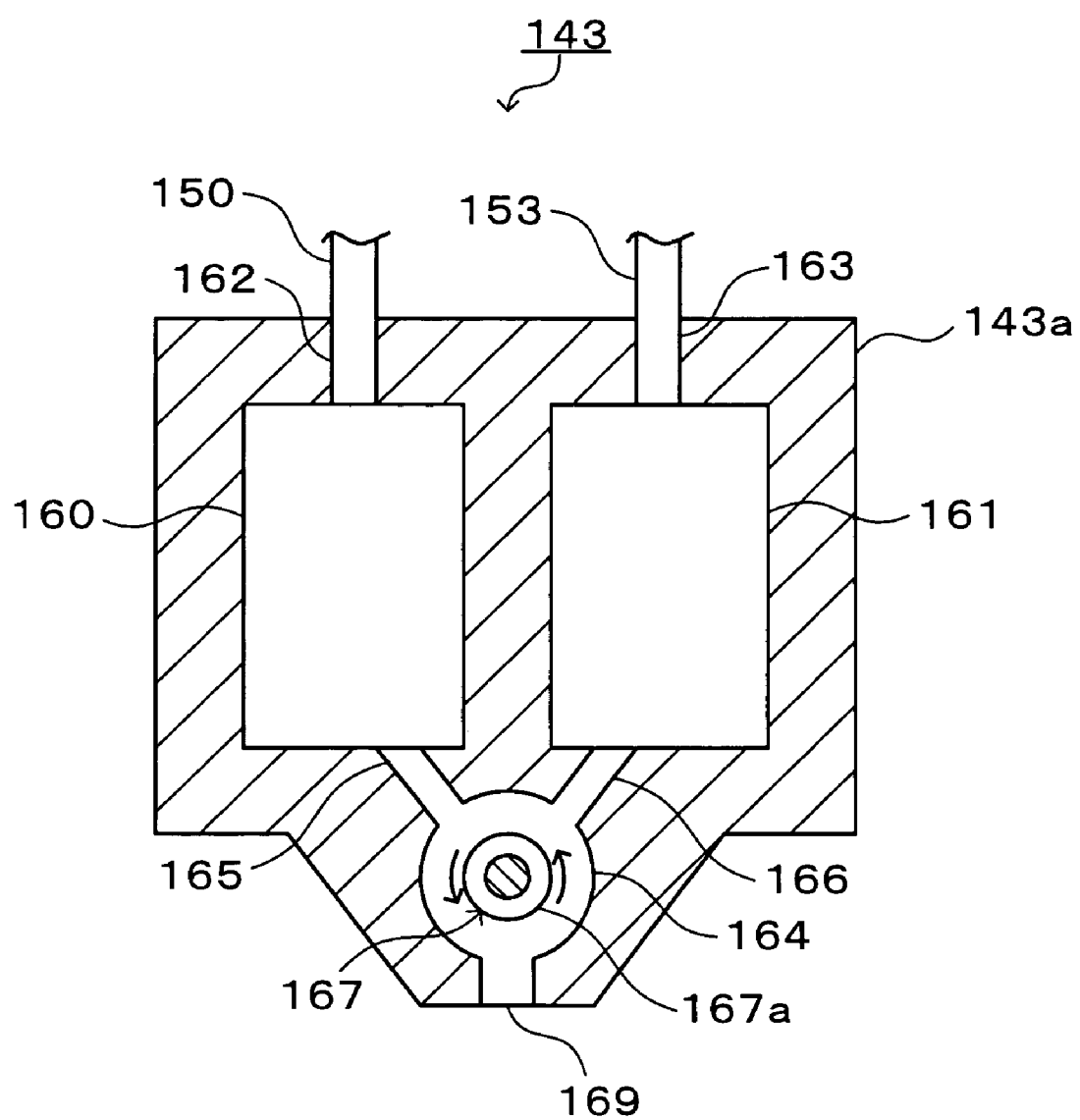
FIG. 6 is a vertical cross-sectional view of a developing solution supply nozzle viewed in an X-direction.
Figure 8A:
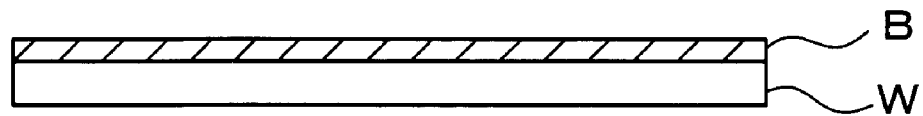
FIGS. 8(A), 8(B), 8(C) and 8(D) are explanatory views to show how a wafer changes as processing of the wafer progresses.
Figure 8B:
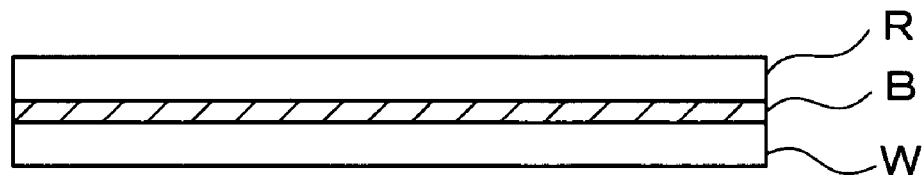
Figure 8C:
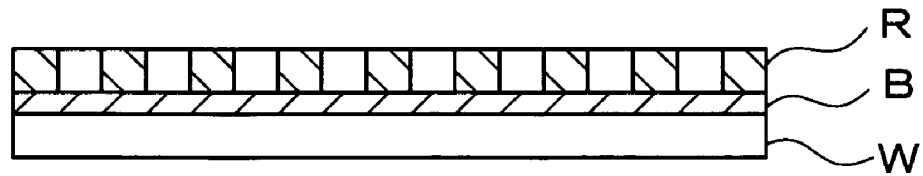
Figure 8D:
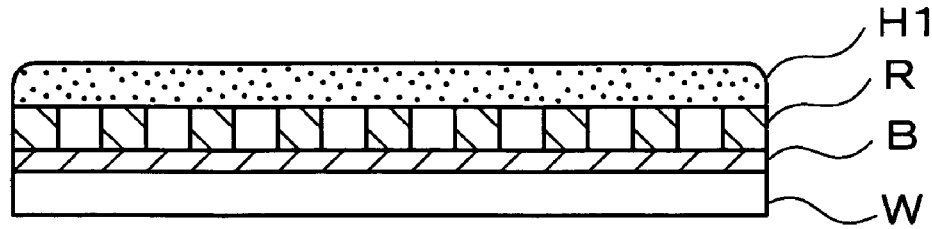

Here, the structure of the developing solution supply nozzle 143 will be detailed. As shown in FIG. 4 and FIG. 5, a main body 143a of the developing solution supply nozzle 143 is longer than, for example, a diameter dimension of the wafer W and has a slender shape along the X direction. As shown in FIG. 6, the main body 143a has in an inner part thereof a developing solution storage chamber 160 and a liquid storage chamber 161 storing the developing solution and the pure water respectively which are introduced into the main body 143a. The developing solution storage chamber 160 and the liquid storage chamber 161 extend from one end portion to the other end portion of the main body 143a along a longitudinal direction thereof as shown in FIG. 7. As shown in FIG. 6, in an upper portion of the main body 143a, a developing solution introducing path 162 extending from an upper surface thereof to communicate with the developing solution storage chamber 160 is formed. The developing solution introducing path 162 is connected to the developing solution supply pipe 150. Further, in the upper portion of the main body 143a, a liquid introducing path 163 extending from the upper surface thereof to communicate with the liquid storage chamber 161 is formed. The liquid introducing path 163 is connected to the liquid supply pipe 153. With such a structure, the developing solution supplied into the developing solution supply nozzle 143 through the developing solution supply pipe 150 flows through the developing solution introducing path 162 to be stored in the developing solution storage chamber 160, and the pure water supplied through the liquid supply pipe 153 flows through the liquid introducing path 163 to be stored in the liquid storage chamber 161.

Under the developing solution storage chamber 160 and the liquid storage chamber 161 in the main body 143a, a mixing chamber 164 is formed. The mixing chamber 164 is formed along the longitudinal direction of the main body 143a, extending from one end portion to the other end portion thereof, for example, as shown in FIG. 7. The mixing chamber 164, for example, as shown in FIG. 6, has a substantially circular vertical cross section as viewed in the X direction. As shown in FIG. 7, the mixing chamber 164 communicates with the developing solution storage chamber 160 via a plurality of first communicating paths 165 arranged at equal intervals along the longitudinal direction. The mixing chamber 164 also communicates with the liquid storage chamber 161 via a plurality of second communicating paths 166 arranged at equal intervals along the longitudinal direction. Therefore, the developing solution in the developing storage chamber 160 and the pure water in the liquid storage chamber 161 flow through the respective communicating paths 165, 166 to be mixed in the mixing chamber 164.

In the mixing chamber 164, a stirring stick 167 smaller in diameter than the mixing chamber 164 is provided as shown in FIG. 7. The stirring stick 167 has on its surface a spiral vane 167a and thus has a spiral shape. The stirring stick 167 extends, for example, between both end portions of the mixing chamber 164, and one end portion thereof is connected to a rotation driving section 168 attached to, for example, a side face of the main body 143a. The rotation driving section 168 has a power generator such as, for example, a motor to be capable of rotating the stirring stick 167 around the axis. Therefore, when the developing solution and the pure water flow into the mixing chamber 164, the stirring stick 167 can be rotated to stir the developing solution and the pure water.

A plurality of discharge ports 169 opening in a lower surface of the main body 143a communicate with a lower portion of the mixing chamber 164. The discharge ports 169 are arranged in a line along the longitudinal direction of the main body 143a at equal intervals between both end portions of the main body 143a. As shown in FIG. 6, each of the discharge ports 169 is smaller in diameter than the mixing chamber 164, and each flow path thereof narrows down when the fluid flows from the mixing chamber 164 to the discharge ports 169.

According to the developing solution supply nozzle 143 as structured above, it is possible to mix the developing solution introduced into the developing solution storage chamber 160 and the pure water introduced into the liquid storage chamber 161 at a predetermined ratio in the mixing chamber 164 and stir the developing solution and the pure water, so that a developing solution with a predetermined concentration and at a predetermined temperature can be produced and the produced developing solution can be discharged uniformly from the discharge ports 169.

Incidentally, the aforesaid other second arm 142 attached to the rail 140 supports a rinsing liquid supply nozzle 180 as shown in FIG. 5. The second arm 142 is movable in the Y direction on the rail 140 when driven by, for example, a driving mechanism 181. Further, the second arm 142 is also movable in the up/down direction when driven by the driving mechanism 181. The second arm 142 is capable of moving the rinsing liquid supply nozzle 180 from a standby section 182 provided outside the cup 122 on the Y-direction positive side to a position above the center portion of the wafer W in the cup 122. The rinsing liquid supply nozzle 180 communicates with a not-shown rinsing liquid supply source provided outside the developing unit 30 and is capable of discharging in a downward direction the rinsing liquid supplied from the rinsing liquid supply source.

Next, the photolithography process of the wafer W conducted in the coating and developing system 1 as structured above will be described. First, when the cassette C housing a plurality of unprocessed wafers W is placed on the mounting table 5, one of the wafers W is taken out of the cassette C and is carried by the wafer carrier 7 to the temperature controller 50 in the third processing unit group G3. The wafer W carried to the temperature controller 50 is temperature-adjusted to a predetermined temperature and is carried to the bottom coating unit 23 by the first carrier 10 thereafter. The wafer W carried to the bottom coating unit 23 is coated with a liquid material of an anti-reflective film, and an anti-reflective film B is formed on the surface of the wafer W as shown in (a) in FIG. 8. A liquid material soluble in the developing solution used for the development treatment in a later process is used to form the anti-reflective film B.

The wafer W on which the anti-reflective film B is formed is carried by the first carrier 10 to the heating unit 82, the high-temperature thermal processing unit 55, and the high-precision temperature controller 60 in sequence and is subjected to predetermined processing in each of the units. Thereafter, the wafer W is carried to the resist coating unit 20, where a resist film R is formed on the anti-reflective film B ((b) in FIG. 8).

The wafer W on which the resist film R is formed is carried to the pre-baking unit 61 by the first carrier 10 and then is carried by the second carrier 11 to the edge exposure unit 84 and the high-precision temperature controller 73 in sequence to be subjected to predetermined processing in each of the units. Thereafter, the wafer W is carried by the wafer carrier 102 of the first interface part 100 to the buffer cassette 104. Next, the wafer W is carried by the wafer carrier 106 of the second interface part 101 to the not-shown aligner. The not-shown aligner exposes the wafer W in a predetermined pattern ((c) in FIG. 8). The hatched portions of the resist film R in (c) in FIG. 8 are portions that have been exposed. The wafer W having been subjected to the exposure processing is carried by the wafer carrier 106 and the wafer carrier 102 to the buffer cassette 103 via the buffer cassette 104. Thereafter, the wafer W is carried by the wafer carrier 102 to, for example, the post-exposure baking unit 74, and after being subjected to the heating processing, is carried by the second carrier 11 to the high-precision temperature controller 71. Thereafter, the wafer W is carried to the developing unit 30.

Here, the development treatment conducted in the developing unit 30 will be detailed. When the wafer W is carried into the developing unit 30 by the second carrier 11, the wafer W is suction-held on the spin chuck 120 as shown in FIG. 4. Subsequently, as shown in FIG. 5, the developing solution supply nozzle 143 having been on standby in the standby section 145 moves in the Y direction toward the positive side to reach a start position P1 which is short of the end of the wafer W on the Y-direction negative side in a plane view. Thereafter, the developing solution supply nozzle 143 moves down to come close to the height of the surface of the wafer W.

Thereafter, the valve 156 and the valve 157 are opened, so that the developing solution with the predetermined concentration in the developing solution supply source 151 and the pure water in the liquid supply source 154 are supplied to the developing solution supply nozzle 143 at predetermined flow rates respectively. Incidentally, the developing solution in the developing solution supply source 151 and the pure water in the liquid supply source 154 may be adjusted to the same temperature in advance by the temperature control sections 152, 155. Further, the flow rates of the developing solution and the pure water supplied to the developing solution supply nozzle 143 are set so that the developing solution, which is produced by mixing the developing solution and the pure water in the developing solution supply nozzle 143, has a desired concentration. The developing solution supplied to the developing solution supply nozzle 143 is tentatively stored in the developing solution storage chamber 160 to flow into the mixing chamber 164 through the first communicating paths 165. The pure water supplied to the developing solution supply nozzle 143 is tentatively stored in the liquid storage chamber 161 to flow into the mixing chamber 164 through the second communicating paths 166. In the mixing chamber 164 to which the developing solution and the pure water has flowed, the stirring stick 167 is rotated by the rotation driving section 168 to stir and mix the developing solution and the pure water in the mixing chamber 164, so that a developing solution H1 at a predetermined concentration is produced in the mixing chamber 164. Note that the concentration optimum for the development of the resist film R is selected as the concentration of the developing solution H1.

The developing solution H1 produced in the mixing chamber 164, after residing in the mixing chamber 164 and being fully stirred, flows into the discharge ports 169 formed in the bottom part thereof to be uniformly discharged from the discharge ports 169. Thus, the developing solution supply nozzle 143 discharges the developing solution H1 to a substantially belt-shaped area between both end portions.

When the discharge of the developing solution H1 is started at the start position P1, the developing solution supply nozzle 143 moves in the Y direction from the start position P1 to a stop position P2 which is located outside the end portion of the wafer W on the Y-direction positive side shown in FIG. 5. While the developing solution supply nozzle 143 thus moves, the developing solution H1 is supplied to the wafer W, so that a solution film of the developing solution H1 is formed on the wafer W ((d) in FIG. 8). On the wafer W on which the solution film of the developing solution H1 is formed, the exposed portions of the resist film R are dissolved in the developing solution H1, and the resist film R is developed. When the developing solution supply nozzle 143 moves to the stop position P2, for example, the valves 156, 157 are closed to stop the discharge of the developing solution H1 from the developing solution supply nozzle 143. The developing solution supply nozzle 143 which has stopped supplying the developing solution H1 is returned to, for example, the start position P1 where the discharge of the developing solution was started.

When a predetermined period of time passes after the developing solution supply nozzle 143 is returned to the start position P1, the valves 156, 157 are opened again, so that the developing solution and the pure water are supplied to the developing solution supply nozzle 143. The flow rates of the developing solution and the pure water at this time are adjusted so that a developing solution H2 lower in concentration than the developing solution H1 is produced in the developing solution supply nozzle 143. The concentration of the developing solution H2 is adjusted to, for example, a concentration with which the developing solution H2 is very low in property of dissolving the resist film R and dissolves only the anti-reflective film B, for example, a concentration half the concentration of the developing solution H1 or lower, for example, a concentration that is about 20% to 50% of the concentration of the developing solution H1. Note that when the concentration of the developing solution H1 is about 0.26 mol/l, the concentration of the developing solution H2 is preferably adjusted to about 0.06 mol/l to about 0.11 mol/l.

Figure 9A:
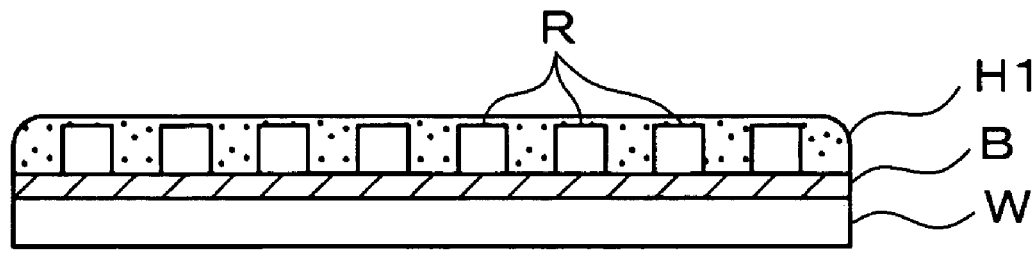
FIGS. 9(A), 9(B), and 9(C) are explanatory views to show how the wafer changes as the processing of the wafer progresses.
Figure 9B:
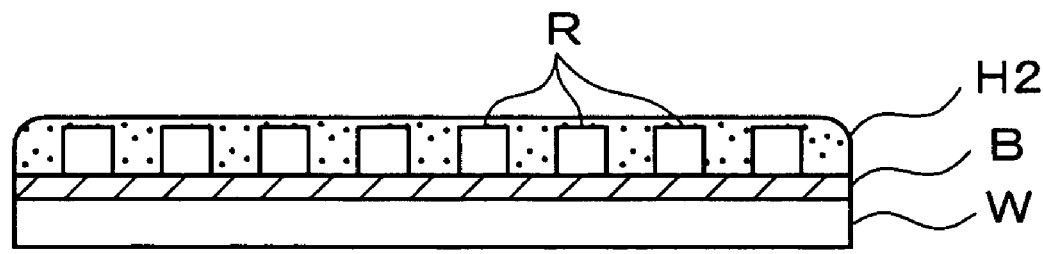
Figure 9C:
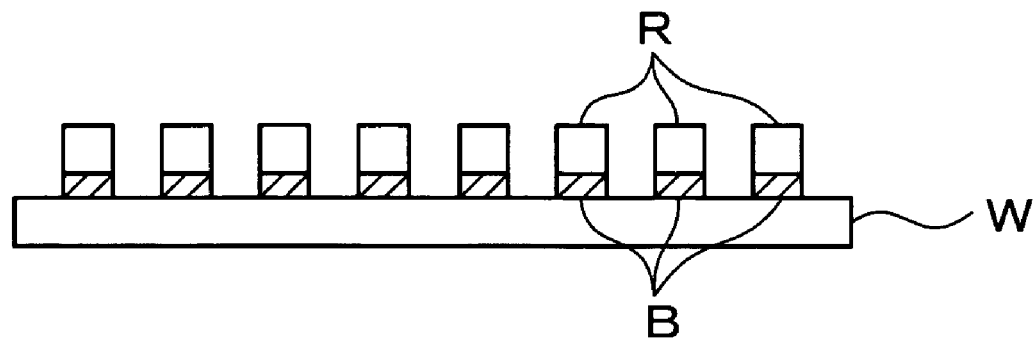

The developing solution supply nozzle 143 is kept on standby while discharging the developing solution H2 at the start position P1. Then, the developing solution supply nozzle 143 moves in the Y direction toward the positive side when the dissolution of the exposed portions of the resist film R reaches, as shown in (a) in FIG. 9, the surface of the anti-reflective film B on the wafer W having the developing solution H1 thereon. The developing solution supply nozzle 143 moves from the start position P1 to the stop position P2 as it does when supplying the developing solution H1. The developing solution H1 on the wafer W is replaced by the developing solution H2, so that a solution film of the developing solution H2 is formed on the wafer W ((b) in FIG. 9). The anti-reflective film B in the exposed portions is dissolved by the developing solution H2 to be removed ((c) in FIG. 9).

The developing solution supply nozzle 143 which has stopped at the stop position P2 stops discharging the developing solution H2 and is returned to the standby section 145. When the developing solution supply nozzle 143 is returned to the standby section 145, the rinsing liquid supply nozzle 180 that has been on standby in, for example, the standby section 182 moves to a position above the center portion of the wafer W, and for example, the inner cup 123 moves up to surround the periphery of the wafer W. Thereafter, the wafer W is rotated by the spin chuck 120 and the rinsing liquid supply nozzle 180 supplies the rinsing liquid to the center portion of the wafer W. Consequently, the developing solution H2 on the wafer W is rinsed away by the rinsing liquid. When the rinsing liquid is supplied for a predetermined period of time and the washing of the wafer W is finished, the supply of the rinsing liquid is stopped, and the rinsing liquid is thereafter scattered for drying by the high-speed rotation of the wafer W.

Thereafter, the rotation of the wafer W is stopped and the wafer W is delivered to the second carrier 11 from the spin chuck 120 to be carried out of the developing unit 30. Thus, a series of the development treatment of the wafer W is finished.

The wafer W having been subjected to the development treatment is carried to, for example, the post-baking unit 65, is carried by the first carrier 11 to the transition unit 51, and thereafter is returned to the cassette C by the wafer carrier 7. Thus, a series of the photolithography processes in the coating and developing system 1 is finished.

According to the embodiment described above, in the development treatment, after the developing solution H1 is supplied to the wafer W to develop the resist film R, the developing solution H2 lower in concentration than the developing solution H1 is supplied to the wafer W to dissolve the anti-reflective film B. Therefore, unlike in the prior art, it is not necessary to use plasma for etching the anti-reflective film for removal, so that the anti-reflective film B can be removed without affecting the resist film R. Further, the new developing solution H2 for dissolving the anti-reflective film B is supplied to the wafer W after the development of the resist film R is finished. Therefore, when the dissolution of the anti-reflective film B is started, the surface of the wafer W is under the uniform condition, so that the anti-reflective film B can be removed uniformly on the surface of the wafer W.

Further, the developing solution H2 dissolving the anti-reflective film B is lower in property of dissolving the resist film than the developing solution H1. Therefore, the resist film R is prevented from dissolving when the anti-reflective film B is dissolved. Moreover, the developing solution supply nozzle 143 has the discharge ports 169 that are arranged in an area longer than the dimension of the wafer W, and the developing solution supply nozzle 143 discharges the developing solution H2 while moving above the wafer W, thereby forming the solution film of the developing solution H2 on the anti-reflective film B. Therefore, it is possible to perform the supply of the developing solution H2 to the whole surface of the wafer W properly and in a short time.

Since the mixing chamber 164 mixing the developing solution in the developing solution storage chamber 160 and the pure water in the liquid storage chamber 161 is provided in the developing solution supply nozzle 143, it is possible to adjust and change the concentration of the developing solution to be discharged from the discharge ports 169 as required. As a result, the developing solution H1 is discharged for developing the resist film R and the developing solution H2 is discharged for dissolving the anti-reflective film B, so that the aforesaid development treatment can be suitably carried out. Further, since the stirring stick 167 is provided in the mixing chamber 164 and the stirring stick 167 can be actively rotated by the rotation driving section 168, it is possible to fully stir and mix the developing solution and the pure water flowing into the mixing chamber 164 to produce the developing solutions H1, H2 without any concentration variation. As a result, the developing solution without any concentration variation is supplied to the wafer W, so that the resist film R and the anti-reflective film B can be uniformly dissolved on the surface of the wafer W. Moreover, the stirring stick 167 has a spiral shape, which can further improve the stirring effect thereof.

Figure 10:
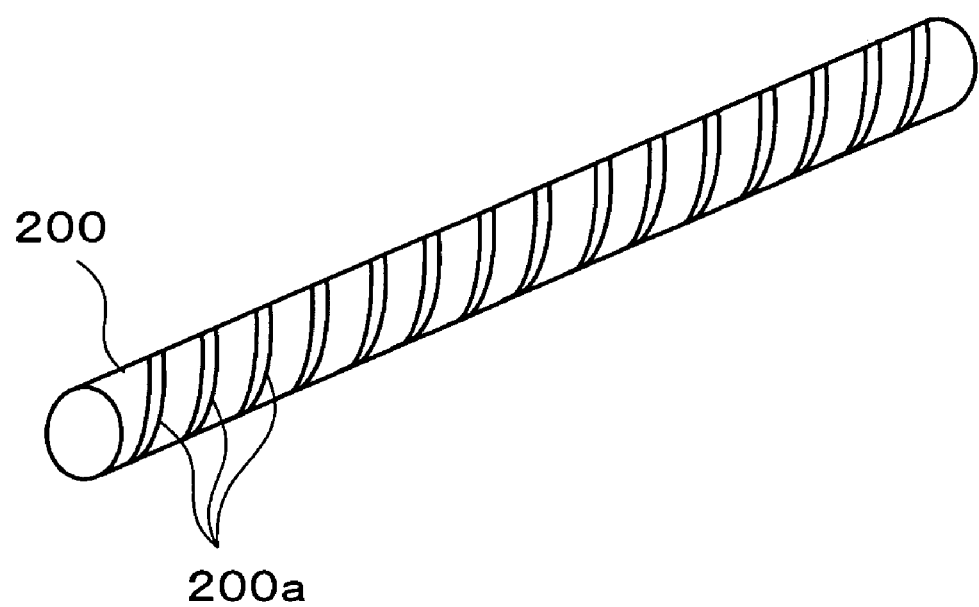
FIG. 10 is a perspective view of a stirring stick in which a groove is formed.
Figure 11:
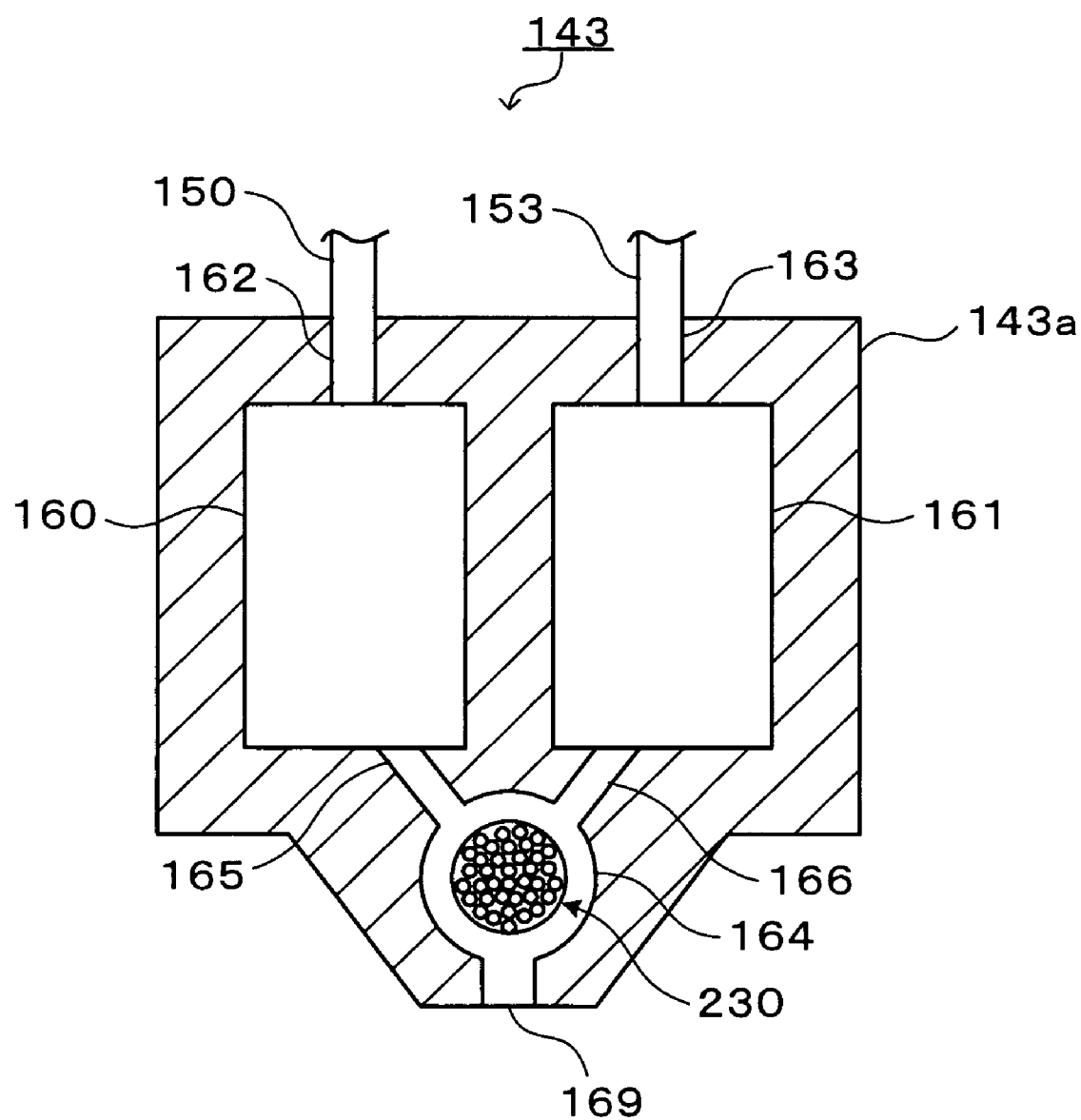
FIG. 11 is a vertical cross-sectional view of a developing solution supply nozzle viewed in the X direction, the nozzle including a porous stirring stick.

Incidentally, the stirring stick 167 described in the above embodiment is formed in a spiral shape by a spiral vane 167a attached to the surface thereof, but it may be formed in the spiral shape by forming a spiral groove 200a on a surface of the stirring stick 200 as shown in FIG. 10. Further, a stirring stick 230 may be formed of a porous material as shown in FIG. 11. In such a case, the developing solution and the pure water permeate through the porous material and the developing solution and the pure water are mixed in the course of the permeation, which can provide a sufficient stirring effect. At this time, a spiral vane may be attached to the stirring stick 210.

Figure 12:
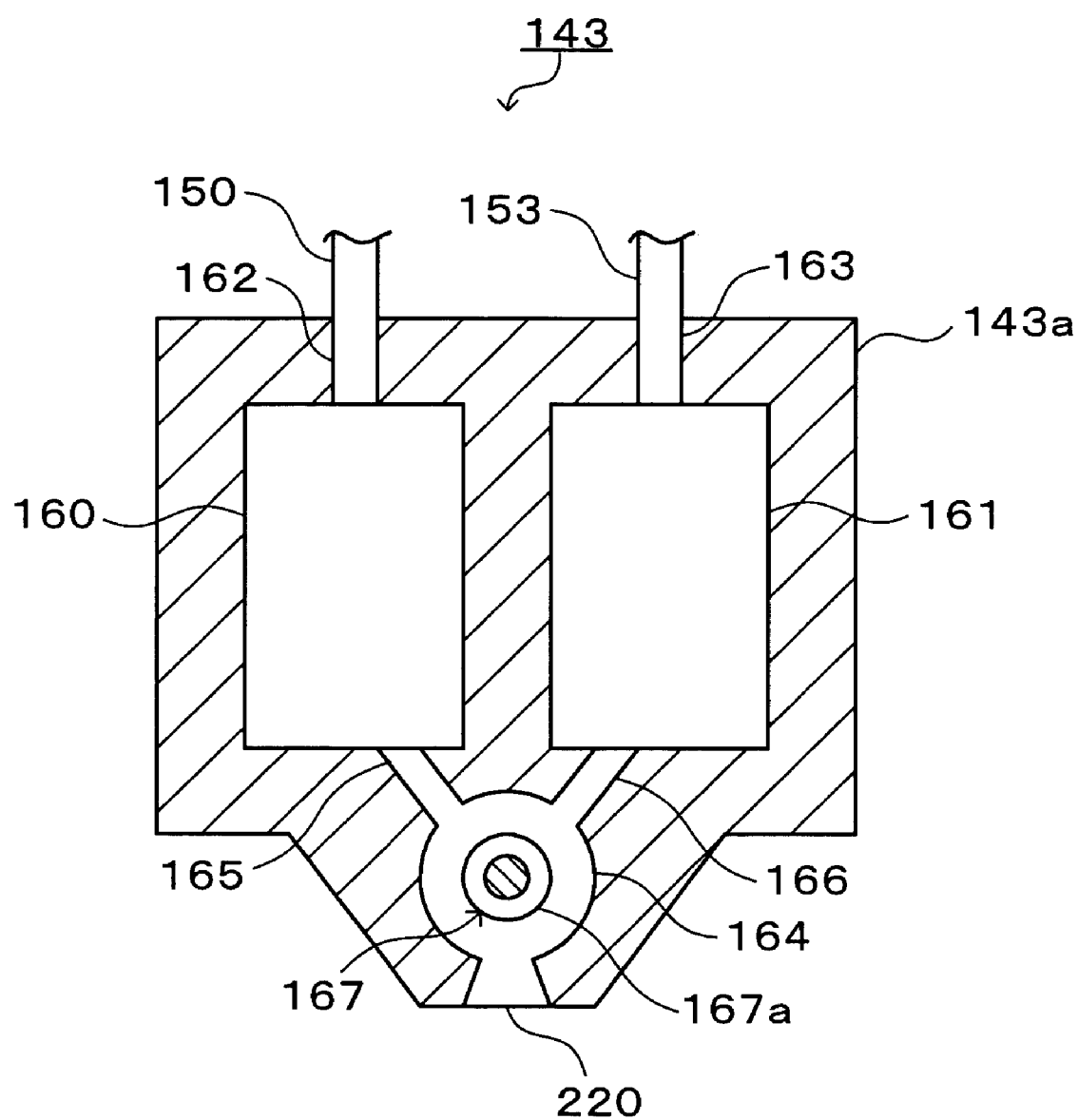
FIG. 12 is a vertical cross-sectional view of a developing solution supply nozzle viewed in the X-direction, the nozzle including gradually widening discharge ports.

In the embodiment described above, the diameter of each of the discharge ports 169 of the developing solution supply nozzle 143 is constant, but the diameter of each of discharge ports 220 may become gradually larger toward the lower surface of the main body 143a from the mixing chamber 164 as shown in FIG. 12. In such a case, the flow path extending from the mixing chamber 164 to the discharge port 220 narrows down once on the lower surface of the mixing chamber 164 and gradually widens toward the opening of the discharge port 220 thereafter. Such a structure can promote the mixture of the developing solution and the pure water since the sufficient residence time of the developing solution in the mixing chamber 164 can be secured. Further, it is possible to reduce the discharge pressure of the discharged developing solution in the discharge ports 220, and as a result, the collision of the developing solution with the wafer W is buffered, so that a development flaw caused by the collision can be reduced.

Figure 13:
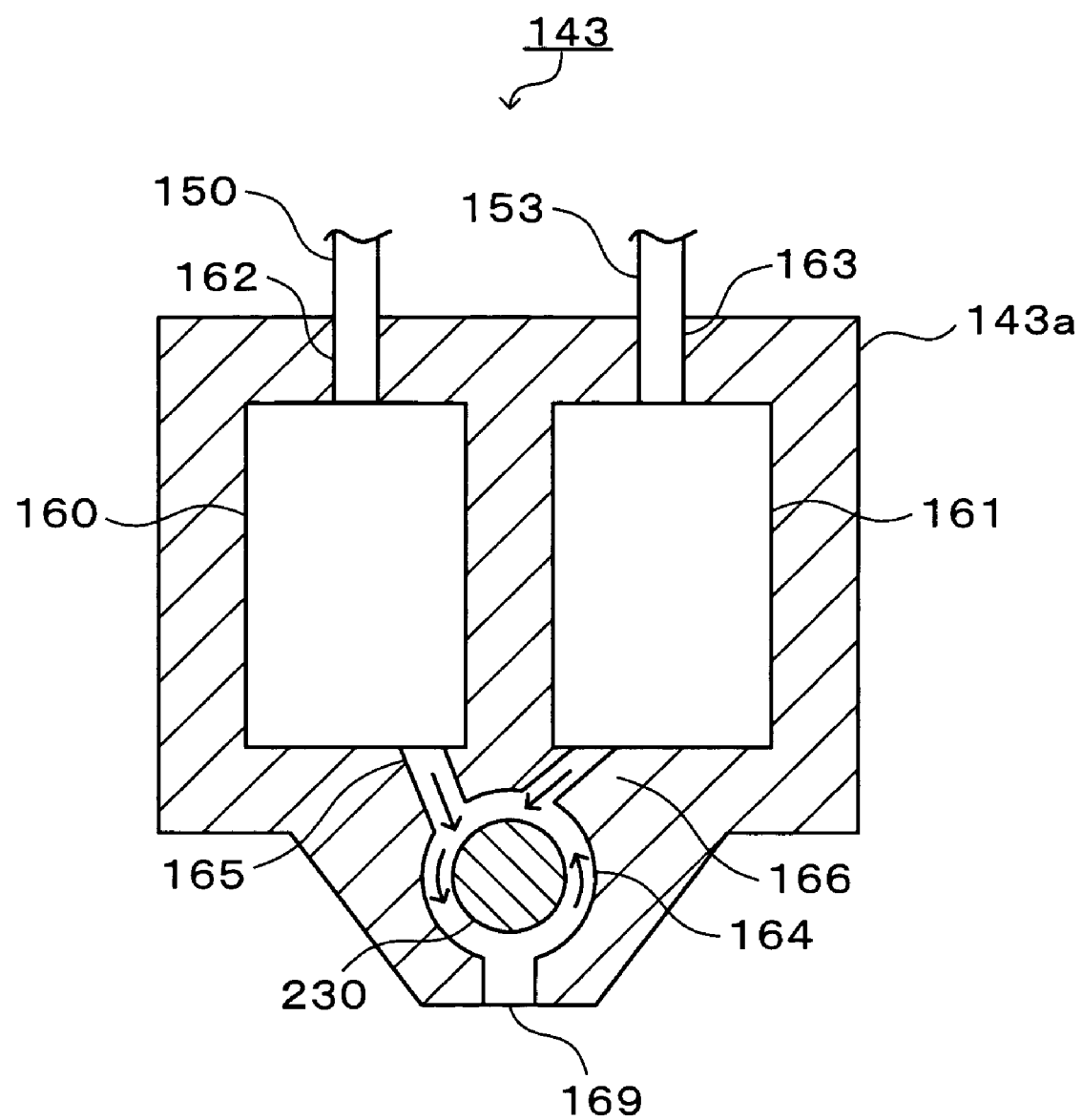
FIG. 13 is a vertical cross-sectional view of a developing solution supply nozzle viewed in the X-direction, in which directions of a first and a second communicating path are changed.
Figure 14:
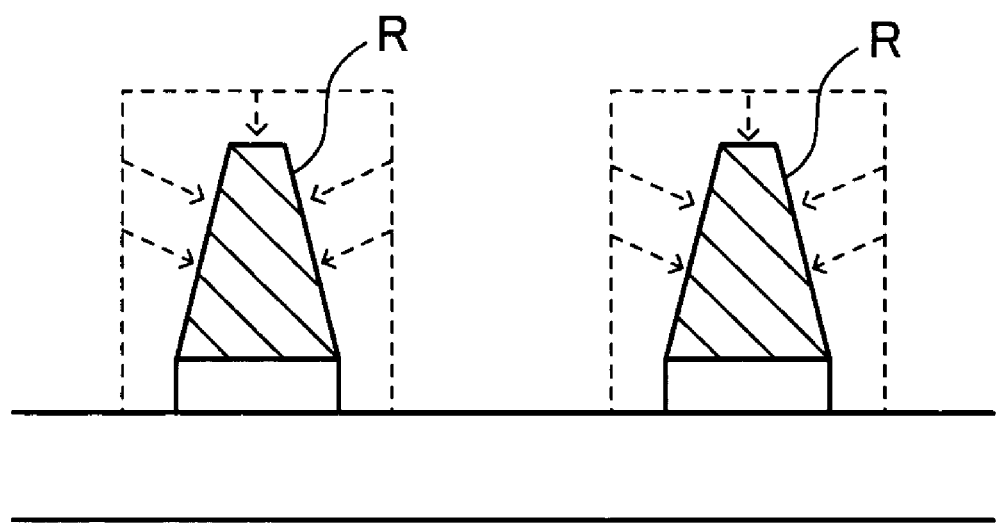
FIG. 14 is an explanatory view showing the state of a resist film when an anti-reflective film is etched by a conventional method.

As shown in FIG. 13, the first communicating paths 165 connecting the developing solution storage chamber 160 and the mixing chamber 164, and the second communicating paths 166 connecting the liquid storage chamber 161 and the mixing chamber 164, which are described in the embodiment above, may be formed such that the flow directions of the developing solution and the pure water are deviated from the axial center of a stirring stick 230, and the developing solution and the pure water flowing in the mixing chamber 164 collide with the surface of the stirring stick 230. In this case, the stirring stick 230 may be disposed in the mixing chamber 164 to be freely rotatable without having the rotation driving section. In such a case, the developing solution and the pure water flowing in the mixing chamber 164 rotate the stirring stick 230, which enables full stirring in the mixing chamber 164.

In the development treatment process described in the above embodiment, the developing solution H2 is supplied to dissolve the anti-reflective film B immediately after the developing solution H1 is supplied to develop the resist film R. However, the developing solution H2 may be supplied after the wafer W is once rotated by the spin chuck 120 to scatter the developing solution H1, following the completion of the development of the resist film R. This can prevent excessive development of the resist film R by the developing solution H1.

In the embodiment described above, the developing solution H2 lower in concentration than the developing solution H1 is supplied to the wafer W for dissolving the anti-reflective film B. However, the developing solution H2 lower in temperature than the developing solution H1 may be supplied for dissolving the anti-reflective film B. In this case, for example, a developing solution instead of the pure water is stored in the liquid supply source 154, and the developing solutions in the developing solution supply source 151 and the liquid supply source 154 are set to different temperatures from each other by the temperature control sections 152, 155. Then, when the resist film R is developed, the developing solutions different in temperature are supplied to the developing solution supply nozzle 143 from the developing solution supply source 151 and the liquid supply source 154. In the mixing chamber 164 in the developing solution supply nozzle 143, the developing solutions different in temperature are mixed at a predetermined ratio to produce the developing solution H1 at a predetermined temperature, and the developing solution H1 is supplied to the wafer W. When the anti-reflective film B is to be dissolved, the ratio of the flow rates of the respective developing solutions supplied from the developing solution supply source 151 and the liquid supply source 154 is changed. Consequently, the mixing ratio of the developing solutions mixed in the developing solution supply nozzle 143 is changed, the developing solution H2 lower in temperature than the developing solution H1 is produced, and the developing solution H2 is supplied to the wafer W. In such a case, it is also possible to appropriately dissolve only the anti-reflective film B since the developing solution H2 lower in property of dissolving the resist film R is supplied to the wafer when the anti-reflective film B is dissolved.

Incidentally, in the embodiment described above, the developing solution H2 supplied for dissolving the anti-reflective film B is lower in concentration or temperature than the developing solution H1 supplied for developing the resist film R. However, the developing solution H2 may be lower both in concentration and in temperature.

The embodiment described above only shows an example of the present invention, and the present invention is not limited to this embodiment but can take various forms. For example, the base film of the resist film R in the embodiment described above is the anti-reflective film B, but it may be other base film such as, for example, a resist film of a different kind. Further, the liquid supplied to the wafer W for dissolving the anti-reflective film B is the developing solution H2, but it may be other developing solution dissolving only the anti-reflective film B. Moreover, in the embodiment described above, the wafer W is used as a substrate, but the present invention is applicable to a substrate other than a wafer, for example, other substrates such as FPD (flat panel display) substrate, a mask substrate, and a reticle substrate.

The present invention is useful in removing a base film of a resist film in a photolithography process of substrate processing.

What is claimed is:

1. A developing solution supply nozzle supplying a developing solution to a substrate, the nozzle comprising:
    a main body in a slender shape having a length substantially equal to or larger than a specific direction dimension of the substrate;
    a developing solution storage chamber extending in said main body in a longitudinal direction of said main body to store the developing solution;
    a liquid storage chamber extending in said main body in the longitudinal direction of said main body to store a predetermined liquid that is to be mixed in the developing solution;
    a mixing chamber which extends in said main body in the longitudinal direction of said main body to communicate with said developing solution storage chamber and said liquid storage chamber and in which the developing solution flowing from said developing solution storage chamber and the liquid flowing from said liquid storage chamber are mixed;
    discharge ports provided in a lower surface of said main body to communicate with said mixing chamber, and having openings arranged along the longitudinal direction to discharge the developing solution mixed in said mixing chamber;
    a stirring stick extending along the longitudinal direction in said mixing chamber to stir the developing solution and the liquid which flow into said mixing chamber; and
    a rotation driving section driving said stirring stick to rotate around an axis of said stirring stick.

2. A developing solution supply nozzle as set forth in claim 1,
    wherein said stirring stick is formed in a spiral shape.

3. A developing solution supply nozzle as set forth in claim 1,
    wherein said stirring stick is made of a porous material.

4. A developing solution supply nozzle as set forth in claim 1,
    wherein said mixing chamber has a circular vertical cross section as viewed in a direction along an axis of said stirring stick.

5. A developing solution supply nozzle as set forth in claim 1,
    wherein a flow path of the developing solution from said mixing chamber to each of said discharge ports in said main body is formed to once narrow down on a downstream side of said mixing chamber and thereafter widen.

6. A developing solution supply nozzle as set forth in claim 1,
    wherein said predetermined liquid is pure water.

7. A developing solution supply nozzle as set forth in claim 1,
    wherein said predetermined liquid is a developing solution lower in temperature than the developing solution stored in said developing solution storage chamber.

8. A developing solution supply nozzle supplying a developing solution to a substrate, the nozzle comprising:
    a main body in a slender shape having a length substantially equal to or larger than a specific direction dimension of the substrate;
    a developing solution storage chamber extending in said main body in a longitudinal direction of said main body to store the developing solution;
    a liquid storage chamber extending in said main body in the longitudinal direction of said main body to store a predetermined liquid that is to be mixed in the developing solution;
    a mixing chamber which extends in said main body in the longitudinal direction of said main body to communicate with said developing solution storage chamber and said liquid storage chamber and in which the developing solution flowing from said developing solution storage chamber and the liquid flowing from said liquid storage chamber are mixed;

discharge ports provided in a lower surface of said main body to communicate with said mixing chamber, and having openings arranged along the longitudinal direction to discharge the developing solution mixed in said mixing chamber;

a stirring stick extending along the longitudinal direction in said mixing chamber to stir the developing solution and the liquid which flow into said mixing chamber; and a flow path extending from said developing solution storage chamber to communicate with said mixing chamber and a flow path extending from said liquid storage chamber to communicate said the mixing chamber, said both flow paths being formed so that the developing solution and the liquid flowing into said mixing chamber from said developing solution storage chamber and said liquid storage chamber flow in directions deviated from an axial center of said stirring stick in said mixing chamber to collide with said stirring stick.

* * * * *